United States Patent
Steckel

(10) Patent No.: US 7,564,170 B2
(45) Date of Patent: Jul. 21, 2009

(54) PIEZOSWITCH

(75) Inventor: Michael Steckel, Vilsbiburg (DE)

(73) Assignee: Lisa Dräxlmaier GmbH, Vilsbiburg (DE)

( * ) Notice: Subject to any disclaimer, the term of this patent is extended or adjusted under 35 U.S.C. 154(b) by 122 days.

(21) Appl. No.: 11/012,133

(22) Filed: Dec. 16, 2004

(65) Prior Publication Data

US 2005/0156483 A1 Jul. 21, 2005

(30) Foreign Application Priority Data

Dec. 17, 2003 (DE) ................. 103 59 297

(51) Int. Cl.
*H01L 41/08* (2006.01)
(52) U.S. Cl. .................... 310/328; 310/339
(58) Field of Classification Search ............ 310/311, 310/339, 328; 362/84; 200/310–317
See application file for complete search history.

(56) References Cited

U.S. PATENT DOCUMENTS

| | | | | |
|---|---|---|---|---|
| 3,698,793 A | * | 10/1972 | Tellerman | 359/290 |
| 4,458,173 A | | 7/1984 | Kaufman et al. | |
| 5,231,326 A | * | 7/1993 | Echols | 310/339 |
| 5,434,757 A | * | 7/1995 | Kashiwagi | 200/317 |
| 5,442,150 A | * | 8/1995 | Ipcinski | 310/339 |
| 5,770,914 A | * | 6/1998 | Pease et al. | 310/339 |
| 5,886,615 A | * | 3/1999 | Burgess | 338/114 |
| 6,104,119 A | | 8/2000 | Guzik et al. | |
| 2002/0079208 A1 | * | 6/2002 | Campana et al. | 200/310 |
| 2003/0144801 A1 | | 7/2003 | Braeuchle et al. | |
| 2004/0075360 A1 | | 4/2004 | Stadelmann | |
| 2005/0133351 A1 | * | 6/2005 | Hein | 200/310 |

FOREIGN PATENT DOCUMENTS

| | | |
|---|---|---|
| DE | 38 22 891 A1 | 1/1990 |
| DE | 197 25 175 C2 | 12/1998 |
| DE | 19927464 A1 | 12/2000 |
| DE | 10054862 A1 | 6/2002 |
| EP | 0502452 A1 | 9/1992 |
| EP | 0 576 400 B1 | 12/1993 |
| EP | 1216911 A2 | 6/2002 |
| WO | WO 87/07767 A1 | 12/1987 |

* cited by examiner

*Primary Examiner*—Jaydi SanMartin
(74) *Attorney, Agent, or Firm*—Sughrue Mion, PLLC

(57) ABSTRACT

An actuating element for a function carrier (4) in a motor vehicle having a piezoelectric element (1), preferably a piezoelectric foil and a decorative surface (2), mounted above the piezoelectric element (1). Further, a system of at least two actuating elements characterized in that the actuating elements have a common piezoelectric element (1), preferably a piezoelectric foil. Finally, a method for the production of such an actuating element or such a system including the steps of producing at least one piezoelectric element (1), applying at least one piezoelectric element (1), connecting each piezoelectric element (1) to an evaluation unit and a control unit, and covering each piezoelectric element (1) preferably with one decorative surface (2).

22 Claims, 1 Drawing Sheet

PIEZOSWITCH

FIELD OF THE INVENTION

The invention relates to an actuating element for a function carrier in a vehicle, a system of at least two such actuating elements as well as a method for the production of such an actuating element or system.

PRIOR ART

In motor vehicles, a plurality of actuation functions or switching-on and switching-off commands for variegated components can be selected, activated or deactivated by means of actuating elements. It is e.g. common practice that the windows, the sliding roof, the outside mirrors or the like are adjusted, lifted, lowered or opened and closed. In addition, a plurality of function buttons is provided in vehicles whereby the electric consumer loads, e.g. heaters, ventilation systems, lighting elements, the radio, the board computer, the navigation system and the like can be switched on or can be adjusted in any desirable manner.

The actuating elements for these function carriers in motor vehicles are usually displaced in the center console, in the instrument panel and/or in or at the steering wheel. The design of the various actuating elements is not only made under the aspect of an advantageous function but must additionally also have an appealing appearance. In connection therewith, it is common practice in particular in the area of the instrument panel and the steering wheel that the actuating elements are mounted in a decorative layer. By closing an electric contact, the actuating elements activate a control device which controls the movement of the individual servo motors for the function carriers.

Within the decorative layers, the actuating elements are mounted such that they palpably project from the surface and that they can be preferably illuminated. This palpable and/or illuminable arrangement of the actuating elements has however the effect that the decorative layer must be discontinuously designed in the area of the actuating elements. Thus, gaps are produced, in particular in the area of the joints from the decorative layer to the individual actuating elements, in which contaminations accumulate in the course of the time which can impair both the function of the actuating element and the appearance of the entire decorative layer.

Further, piezoswitches are known from prior art which are e.g. used in cerane cooking areas, coffee machines or in the so-called "vandalism-safe" keyboards, in particular in the selection keys of automated teller machines. Such piezoelectric and press-intensive keys are e.g. known from DE 693 04 443 T2. This document is herewith introduced as a reference and is thus a part of the disclosure.

However, these piezoelectric keys or keyboards represent a problem regarding the possible illumination or the palpable design of the keys.

REPRESENTATION OF THE INVENTION

It was therefore an object of the invention, to provide an actuating element for a function carrier in a motor vehicle which does no longer have the problems known from prior art.

The actuating element according to the invention for a function carrier in a motor vehicle has a piezoelectric element which is mounted below a decorative layer. It was therein extraordinarily surprising to the skilled person that piezoelectric elements can be mounted in a motor vehicle below a decorative layer so that it is to a large extent possible to abstain from the mechanical actuating elements known from the prior art.

Further, it was surprising to the skilled person that also high-quality decorative materials could be used when piezoelectric components can be stretched over the actuating elements since the actuation path for the activation of the actuating element is particularly small, it is usual in the range of a few micrometers, and since a comparable rigid decorative surface does essentially not offer resistance against such a small deformation either. In addition, due to the minimum deformation path, a nearly wear-free design of the actuating elements is possible.

In particular, if piezoelectric foils are used, the required space of the actuating elements can be reduced to a minimum, which allows to displace a greater number of actuating elements in a small space, e.g. on the covering of the steering wheel. In addition, the function of each actuating element can to a large extent be variably set.

The system according to the invention of at least two actuating elements is characterized in that at least two actuating elements are connected with one common piezoelectric element, preferably one piezoelectric foil. This allows to block-wisely combine, to produce or to control various actuating elements, which allows to simplify the production and the incorporation of the actuating elements in a particularly advantageous manner.

The method for the production of such an actuating element or such a system includes the application of the piezoelectric element at the location provided for the actuating element, the connection of each piezoelectric element with an evaluation unit and a control unit, as well as the covering of each piezoelectric element preferably with one single decorative surface. The method according to the invention is especially simple to enable, it provides particularly space-saving actuating elements and is therefore also suited for the disposal of actuating elements in locations, for which the covering with preferably high-quality decorative materials was particularly difficult.

The invention provides in its entirety the possibility to provide actuating elements in motor vehicles, which are preferably individually controllable/automatically controllable, and the structure of which is particularly simple and cost-effective.

In a preferred embodiment of the actuating element according to the invention, the piezoelectric element consists of a piezoelectric foil. In a particularly preferred embodiment, this piezoelectric foil consists of at least two layers arranged one on top of the other. In a particularly preferred embodiment, the piezoelectric foil is a laminate of several foils connected to each other, preferably bonded one on top of the other. In an extraordinary preferred embodiment of the actuating element according to the invention, the individual foils are at least partially covered with active surfaces. These active surfaces can preferably be applied to the individual foils in the screen printing method.

An actuating element is thereby created which is designed especially flat and flexible and requires minimum space, on the one hand, and which can be produced in an especially simple manner, on the other.

In a further advantageous embodiment of the invention, the piezoelectric element is connected to a function carrier, so that the tension produced by the element by pressure on the piezoelectric element and the electric impulse which is thereby generated can exert a direct influence on the function carrier. In a further preferred embodiment of the invention, this function carrier serves for switching on or off, opening or closing or adjusting component parts, actuating members, electronic or electric vehicle components or the like.

An actuating element is thereby created which has preferably an identical design and is in the position to trigger, terminate and/or control a plurality of various functions.

In a further preferred embodiment of the actuating element according to the invention, the piezoelectric element is connected to an evaluation unit, preferably to an electronic evaluation system. An actuating element is thereby advantageously created which can be adapted particularly advantageously to the different requirements and conditions of the function carriers selected by the operator.

In a further preferred embodiment of the invention, the evaluation unit is additionally connected to a control unit. The possibility is thereby created to control the individual function carrier preferably independently of each other in a manner adapted to the respective function carrier. Preferably is it possible to individually control by means of such a control unit both the velocity and the duration of a movement carried out by the function carrier.

It can e.g. be desired that certain movements of actuating members are carried out only during one actuation pulse, while opening and closing movements, e.g. of shutter elements, window levers and sliding roofs are completely performed independently of the actuation duration of the actuating element.

In an particularly preferred embodiment of the invention, threshold values for triggering an actuating signal are therefore stored in the evaluation unit. In an extraordinary preferred embodiment of the invention, such threshold values include the duration of the pressure, the pressure force and/or the number of the pressure pulses applied by the operator to the actuating element. These threshold values can also be stored in the form of corresponding voltage values and/or current pulses in the evaluation unit. A device is thereby created which allows that each individual function carrier can thus preferably be controlled with an adapted pressure force and/or pressure duration. It is further possible that triggering of function carriers by inadvertently touching the actuating element or by mechanical forces acting on the actuating element for a short time, e.g. in case of a crash, is definitely avoided.

In a further preferred embodiment of the invention, the actuating element, preferably a plurality of actuating elements, is covered by a decorative surface which is not disconnected in the edge areas of the actuating element. In a particularly preferred embodiment of the invention, no gaps or the like are present at the edges of each actuating element.

An actuating element is thereby created which without affecting the function definitely prevents that soil particles or liquids enter. Advantageously, it is particularly possible that the interior of a motor vehicle is wet-cleaned without the risk of impairment or failure of the individual actuating element or the plurality of actuating elements.

In a further preferred embodiment, the decorative surface has a symbol in the area of the actuating element. In a particularly preferred embodiment of the invention, this symbol is adapted to the function of the function carrier to be actuated by the actuating element. In an especially preferred embodiment, the decorative surface is made transparent in the area of the symbol and thereby allows a back-lighting of this area. In an extraordinary preferred embodiment, this back-lighting of the symbol and/or of the actuating element is realized by a light-emitting diode and/or by means of a light-emitting foil disposed below the decorative surface.

This allows to illuminate individual actuating elements or the entire switchboard, which facilitates selection and actuation of each element especially when it is dark in the passenger compartment. In a particular advantageous manner, a selection can be made between different intensities of the background-lighting, which e.g. allows the display of an activation indication for individual actuating elements. The intensities are therein preferably adapted such that the background lighting allows identification of an activation condition also at daylight.

In a further advantageous embodiment of the invention, an optical or acoustical feedback follows when the actuating element was touched. An optical feedback preferably follows by switching on a function display or by a change of the light intensity output by the function indication.

Also preferred is an acoustical feedback when the touch of the actuating element was detected, as well as when the function selected by the operator has been performed. In a particularly preferred manner, such an acoustical feedback is output via a loudspeaker which acoustically converts a signal generated by the electronic system.

In addition, an acoustical feedback may also be performed via a relay connected to the actuating element, in which a noise signal is generated by opening and/or closing a contact which indicates detection and performance of the command of an operator.

In a particularly preferred embodiment of the invention, the actuation of the actuating element is sensibly indicated. This is advantageously made by a bobbin connected to a relay which hits the actuating element from behind when the actuating element is touched, and thus sensibly indicates to the operator that the command was detected and the function performed.

In an extraordinary preferred embodiment of the invention, the indication is carried out in more than the ways indicated above. Thus, an optical and acoustical, as well as acoustical and haptic, i.e. sensible, indication of the actuation is preferred.

In accordance with a further aspect of the invention, a system of at least two of the above-described actuating elements is provided, in which the actuating elements are mounted above a common piezoelectric element, preferably a piezoelectric foil. This allows to evaluate the signals of more than one actuating element in one single electronic system and/or use one common control device. In a particularly preferred embodiment of the invention, the actuating elements are at least partially combined in blocks, at least one block being connected to one common piezoelectric element. This provides the possibility that the circuit boards in a motor vehicle are produced in a particularly simple and cost-effective manner.

In a further, particularly preferred embodiment of the system according to the invention, at least two actuating elements have a common evaluation unit, preferably an electronic evaluation system. This allows that the actuating elements, which should essentially act in the same manner and/or should be controlled or actuated essentially in the same manner, are preferably combined in blocks. This also allows to minimize in a particularly advantageous manner the apparatus expenditure for the production of switching and actuating units which are to be used in vehicles.

In a further preferred embodiment of the system of the invention, at least two actuating elements have a common control unit. This is especially advantageous in cases that the servo motors which are selected via the various actuating elements are intended act in an essentially identical manner. This is e.g. the case when the electric window lifters, the electric outside mirror adjustment systems or the like are controlled.

In accordance with a third aspect of the present invention, a method for the production of an above-described actuating element or an above-described system is provided. The method comprises the production of a piezoelectric element preferably in the form of a foil, the application of which at the position provided therefore in the motor vehicle, the connection of each piezoelectric element with an evaluation unit and a control unit, as well as the covering of each piezoelectric element with a decorative surface.

In a particularly advantageous manner, the covering of all piezoelectric elements is performed by use of one single decorative surface. A method is provided thereby which can be performed in a particularly simple manner und which provides a decorative surface with a minimum of joints. The penetration of soil particles or liquids below the decorative surface is thereby safely prevented, further, the decorative surface does also not have openings, from which the formation of cracks could start which proceed in the decorative surface.

In a preferred embodiment of the method of the invention, additional means for an illumination from behind, preferably light-emitting diodes and/or light-emitting foils are arranged below the decorative layer. In a particularly preferred embodiment of the method of the invention, a common light-emitting foil serves for illuminating a plurality of actuating elements from behind.

In a further preferred embodiment of the method according to the invention, the piezoelectric element is made of a laminate of foils one placed on top of the other, the active surfaces of which are produced in the screen printing method. This allows that the piezoelectric foil is produced with especially simple methods which are, in addition to this, under exact control.

BRIEF DESCRIPTION OF THE DRAWING

In the following, the present invention is explained in detail by means of FIG. 1, this FIGURE only showing one embodiment of a systems according to the invention by way of example. However, this FIGURE is not meant to somehow or other limit the general idea of the invention.

ENABLEMENT OF THE INVENTION

Figure 1:
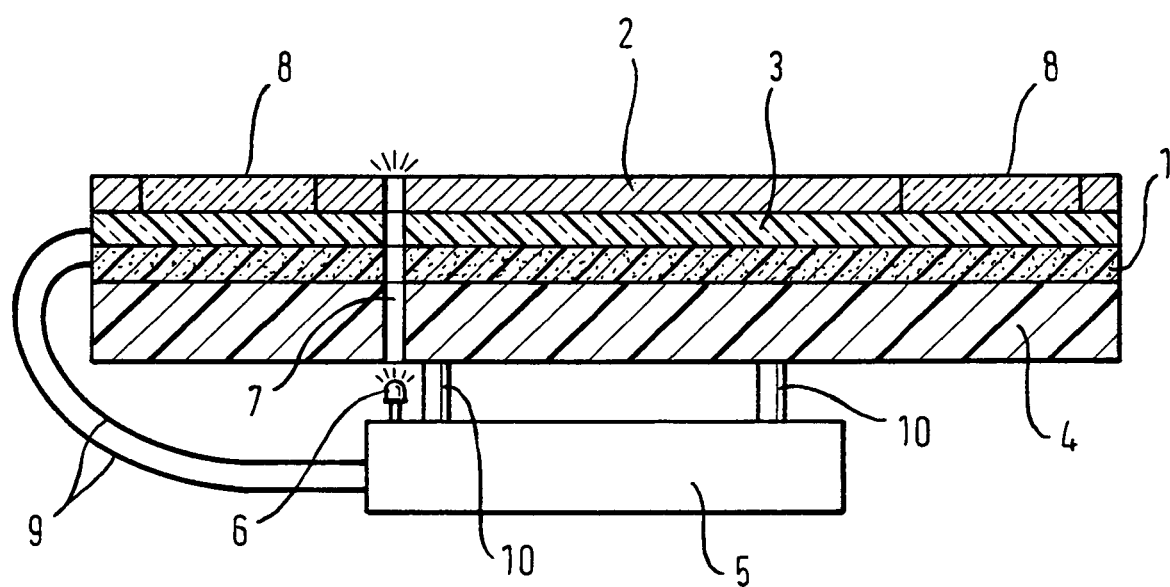
FIG. 1 shows the cross-section of a side view of the system according to the invention.

In FIG. 1, a system of two actuating elements is represented which are mounted above one single piezoelectric foil 1. The system is mounted on a function carrier 4, e.g. an instrument panel, and has a piezofoil 1, a light-emitting foil 3 mounted above the piezofoil 1, as well as a completing decorative surface 2. In this decorative surface 2, transparent tip surfaces 8 are arranged, through which the light emitted by the light-emitting foil 3 can shine. An electronic evaluation and control system 5 is connected to the piezoelectric foil 1 and the light-emitting foil 3 via the lines 9, by means of which the forces applied via the tip surfaces 8 to the piezofoil 1 are detected, on the one hand, and a possible lighting of the light-emitting foil 3 is activated, on the other. A light-emitting diode 6 is further connected to the electronic system 5, which is connected by the fastening means 10 with the function carrier 4, the light of which may pass, in case of an activation the electronic system 5, though the channel 7 leading through the function carrier 4, the piezoelectric foil 1, the light-emitting foil 3, as well as through the decorative surface 2 to the outside.

What is claimed is:

1. An actuating device for a function carrier (4) in a motor vehicle, the actuating device comprising:
   a piezoelectric element (1); and
   a decorative surface (2) mounted above the piezoelectric element (1);
   wherein a portion of the decorative surface (2) defines an actuating element, such that the decorative surface (2) extends continuously and beyond edge areas of the portion defining the actuating element;
   wherein the decorative surface (2) is deformable and deformation of the decorative surface towards the piezoelectric element, at the portion defining the actuating element, activates the actuating element; and
   wherein the piezoelectric element is a laminate of a plurality of foils connected to each other, one on top of the other.

2. The actuating device according to claim 1, wherein the individual foils are at least partially covered with active surfaces.

3. The actuating device according to claim 1, wherein the function carriers (4) serves for at least one of (i) switching on and off at least one of component parts, actuating members and electronic or electric vehicle components, (ii) opening and closing at least one of component parts, actuating members and electronic or electric vehicle components, and (iii) adjusting at least one of component parts, actuating members, and electronic or electric vehicle components.

4. The actuating device according to claim 1, wherein the piezoelectric element (1) is connected to the function carrier (4).

5. The actuating device according to claim 1, wherein the piezoelectric element (1) is connected to an evaluation unit.

6. The actuating device according to claim 5, wherein threshold values for triggering an actuation signal are stored in the evaluation unit.

7. The actuating device according to claim 6, wherein the threshold values are at least one of (i) a pressure duration, (ii) a pressure force, (iii) a number of pressure pulses, (iv) voltage values corresponding to at least one of the pressure duration, the pressure force and the number of pressure pulses, and (v) current pulses corresponding to at least one of the pressure duration, the pressure force and the number of pressure pulses.

8. The actuating device according to claim 1, wherein the evaluation unit is connected to a control unit.

9. The actuating device according to claim 1, wherein the decorative surface (2) has a symbol in the area of the actuating element.

10. The actuating device according to claim 9, wherein the decorative surface (2) is transparent in the area of the symbols and has a lighting of the actuating element from behind.

11. The actuating device according to claim 10, wherein the actuating element is lighted by means of at least one of a light-emitting diode and a light-emitting foil (3) which is mounted below the decorative surface (2).

12. The actuating device according to claim 1, wherein the touching of the actuating element is indicated by a feedback.

13. The actuating device according to claim 12, wherein the feedback is at least one of optical and acoustic.

14. The actuating device according to claim 1, wherein at least two actuating elements are defined and wherein the actuating elements have a common piezoelectric element (1).

15. The actuating device according to claim 14, wherein the actuating elements are at least partially combined in blocks and wherein at least one block has a common piezoelectric element (1).

16. The actuating device according to claim 14, wherein at least two actuating elements have a common evaluation unit.

17. The actuating device according to claim 14, wherein at least two actuating elements have a common control unit.

18. A method for the production of an actuating device of at least two actuating elements according to claim 14, comprising:
producing a piezoelectric element (1),
applying the piezoelectric element (1) to the function carrier in the motor vehicle,
connecting the applied piezoelectric element (1) to an evaluation unit and to a control unit, and
covering the applied piezoelectric element (1) with at least one decorative surface (2),
wherein portions of the at least one decorative surface (2) define the at least two actuating elements, such that the at least one decorative surface (2) extends continuously and beyond edge areas of the portions defining the at least two actuating elements,
wherein the at least one decorative surface (2) is deformable and deformation of the at least one decorative surface towards the applied piezoelectric element, at the portions defining the at least two actuating elements, activates the at least two actuating elements, and
wherein the piezoelectric element (1) is a piezoelectric foil, consisting of a laminate of foils which are arranged one on top of the other, the active surfaces thereof being produced by a screen printing method.

19. A method for the production of an actuating device according to claim 1, the method comprising:
producing a piezoelectric element (1),
applying the at least one piezoelectric element (1) to the function carrier in the motor vehicle,
connecting each applied piezoelectric element (1) to evaluation unit and to a control unit, and
covering each applied piezoelectric element (1) with at least one decorative surface (2),
wherein a portion of the at least one decorative surface (2) defines an actuating element, such that the at least one decorative surface (2) extends continuously and beyond edge areas of the portion defining the actuating element,
wherein the at least one decorative surface is deformable and deformation of the at least one decorative surface towards each applied piezoelectric element, at the portion defining the actuating element, activates the actuating element, and
wherein the piezoelectric element (1) is a piezoelectric foil, consisting of a laminate of foils which are arranged one on top of the other, the active surfaces thereof being produced by a screen printing method.

20. The method according to claim 19, wherein lighting means (3) are mounted below the decorative surface (2).

21. The method according to claim 19,
wherein there are no gaps provided between the at least one decorative surface and the edge areas of the actuating element.

22. The actuating device according to claim 1,
wherein there are no gaps provided between the decorative surface and the edge areas of the actuating element.

* * * * *